United States Patent
Kajita et al.

(10) Patent No.: US 12,190,962 B2
(45) Date of Patent: Jan. 7, 2025

(54) NONVOLATILE MEMORY WRITING DEVICE

(71) Applicant: Mitsubishi Electric Corporation, Tokyo (JP)

(72) Inventors: Atsushi Kajita, Tokyo (JP); Choji Hirota, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 163 days.

(21) Appl. No.: 17/728,229

(22) Filed: Apr. 25, 2022

(65) Prior Publication Data
US 2022/0383957 A1  Dec. 1, 2022

(30) Foreign Application Priority Data

May 26, 2021 (JP) .................................. 2021-088067
Nov. 12, 2021 (JP) .................................. 2021-184522

(51) Int. Cl.
| | | |
|---|---|---|
| *G11C 16/10* | (2006.01) | |
| *G11C 16/22* | (2006.01) | |
| *G11C 16/30* | (2006.01) | |
| *B60R 16/033* | (2006.01) | |

(52) U.S. Cl.
CPC .............. *G11C 16/22* (2013.01); *G11C 16/10* (2013.01); *G11C 16/30* (2013.01); *B60R 16/033* (2013.01)

(58) Field of Classification Search
CPC ......... G11C 16/22; G11C 16/10; G11C 16/30; B60R 16/033; Y02D 10/00
See application file for complete search history.

(56) References Cited

U.S. PATENT DOCUMENTS

| | | | |
|---|---|---|---|
| 10,755,789 B1* | 8/2020 | Kao ......................... | G11C 7/24 |
| 11,386,943 B2* | 7/2022 | Huang ..................... | G11C 7/02 |
| 2010/0265785 A1* | 10/2010 | Lee ....................... | G11C 16/225 |
| | | | 365/229 |
| 2011/0110173 A1* | 5/2011 | Chang .................... | G11C 5/143 |
| | | | 711/E12.001 |

FOREIGN PATENT DOCUMENTS

JP         2002-099468 A        4/2002

* cited by examiner

*Primary Examiner* — Mohammed A Bashar
(74) *Attorney, Agent, or Firm* — Sughrue Mion, PLLC; Richard C. Turner

(57) ABSTRACT

In a nonvolatile memory writing device that writes writing data transmitted from the microcomputer to a nonvolatile memory provided outside the microcomputer, the nonvolatile memory is a nonvolatile memory in which writing is protected and the protection is disabled by an electric signal from the microcomputer to the write-protect terminal of the nonvolatile memory, the write-protect terminal is connected to the power supply of the microcomputer, and when the electric signal from the microcomputer to the write-protect terminal is interrupted, the protection is disabled, even when the data is interrupted due to a change in the power supply voltage, it is possible to prevent garbled date due to the write protection signal during the write period of the write data.

18 Claims, 13 Drawing Sheets

NONVOLATILE MEMORY WRITING DEVICE

TECHNICAL FIELD

The present application relates to a nonvolatile memory writing device.

BACKGROUND ART

Many of the products controlled by an electronic control device use a nonvolatile memory in the electronic control device to record the previous operating information or the failure information and record the information.

For example, in an electronic control device for vehicle, the failure information has to be recorded in the electronic control devices according to the on-board diagnostics (OBD) regulations.

As a concrete correspondence example, the electronic control device can record the failure information according to the position of the external nonvolatile memory IC mounted on an integrated circuit (hereinafter referred to as IC), separately from a microcomputer.

Further, external the nonvolatile memory IC often has a write-protect terminal that sets the write-protect function by electrically using a High or Low signal for the writing protection/permission, when not writing to the external nonvolatile memory IC, writing to the memory is prohibited to prevent writing at unintended timing, writing protection/permission is controlled from a microcomputer.

In this case, the general writing order is as follows.
1) The write protection of the external nonvolatile memory IC is disabled by the microcomputer (writing permission).
2) The data is sent to the external nonvolatile memory IC from the microcomputer.
3) The data is completely sent to the external nonvolatile memory IC from the microcomputer.
4) Writing of the date in the external nonvolatile memory IC.
5) The write protection of the external nonvolatile memory IC is enabled by the microcomputer (writing protection).

PRIOR ART DOCUMENT

Patent Literature

[Patent Literature 1] JP 2002-99468 A1

DISCLOSURE OF INVENTION

Technical Problem

When writing the data to the external nonvolatile memory, the system is set up so that the power of the electronic control device is not turned off by the user operation during the writing of the data.

For example, by turning on the internal self-hold circuit separately from the power switch, the system is built so that the power supply is controlled at a timing different from the user's power switch operation, and the power of the electronic control device is not turned off during the writing period to the external nonvolatile memory.

Under normal conditions, the power of the electronic control device does not turn off while writing to the external nonvolatile memory, but during writing, if the power supply is cut off differently from the normal operation due to disconnection of the power supply path, instead of the user's switch operation, the power supply is cut off, and the power of the electronic control device may be stopped while writing to the external nonvolatile memory.

When the power of the electronic control device is stopped, the behavior in the electronic control device is generally in the order of microcomputer reset→microcomputer stop→external nonvolatile memory IC stop.

When the external nonvolatile memory IC has a write protection function, the circuit is set in the direction to prohibit writing during the reset of the microcomputer, when writing in the external nonvolatile memory IC at the moment when the microcomputer is reset, a write-protected signal will be input during writing. As the behavior of the external nonvolatile memory IC in this case, garbled data may occur.

For example, in the write control circuit shown in the Japanese Patent Application JP 2002-99468 A1 (Patent Literature 1), a resistor is connected to the power supply side (write-protect side) of the write control line (write-protect terminal), when a reset signal is input and the OR circuit itself is stopped, it is in a write-protected state.

The present application discloses a technique made in view of the above circumstances, and the purpose is to prevent garbled data due to a write-protected signal during the data writing period of the nonvolatile memory, even if the power supply voltage changes and the write protection signal transmitted from the microcomputer to the nonvolatile memory provided outside the microcomputer is interrupted.

Solution to Problem

The nonvolatile memory writing device disclosed in the present application is a nonvolatile memory writing device that writes data transmitted from the microcomputer to a nonvolatile memory provided outside the microcomputer, the nonvolatile memory is a nonvolatile memory in which writing of the data is prohibited and the prohibition is disabled by an electric signal from the microcomputer to the write protect terminal of the nonvolatile memory, the write protect terminal is connected to the power supply of the microcomputer, when the electrical signal from the microcomputer to the write protect terminal is interrupted, the write protect terminal is in a state of disabling the prohibition.

Advantageous Effects of Invention

In the nonvolatile memory writing device disclosed in the present application, even if the write protect signal from the microcomputer to the nonvolatile memory is interrupted due to a change in the power supply voltage of the microcomputer while writing data in the nonvolatile memory, garbled data due to write-protected signals during the data writing period in the nonvolatile memory does not occur.

DESCRIPTION OF EMBODIMENTS

Hereinafter, embodiments of the nonvolatile memory writing device according to the present application will be described with reference to the drawings. Note that the present application is not limited to the following description, and can be appropriately modified without departing from the summary of the present application. In the following drawings, for easy understanding, the scales of the respective members may be different from the actual scales, and illustration of configurations not related to the features of the present application is omitted.

First Embodiment

Hereinafter, an embodiment of the present application will be described with reference to a circuit diagram, using an electronic control device (hereinafter abbreviated as "ECU") for electronic engine control as an example.

Figure 1:
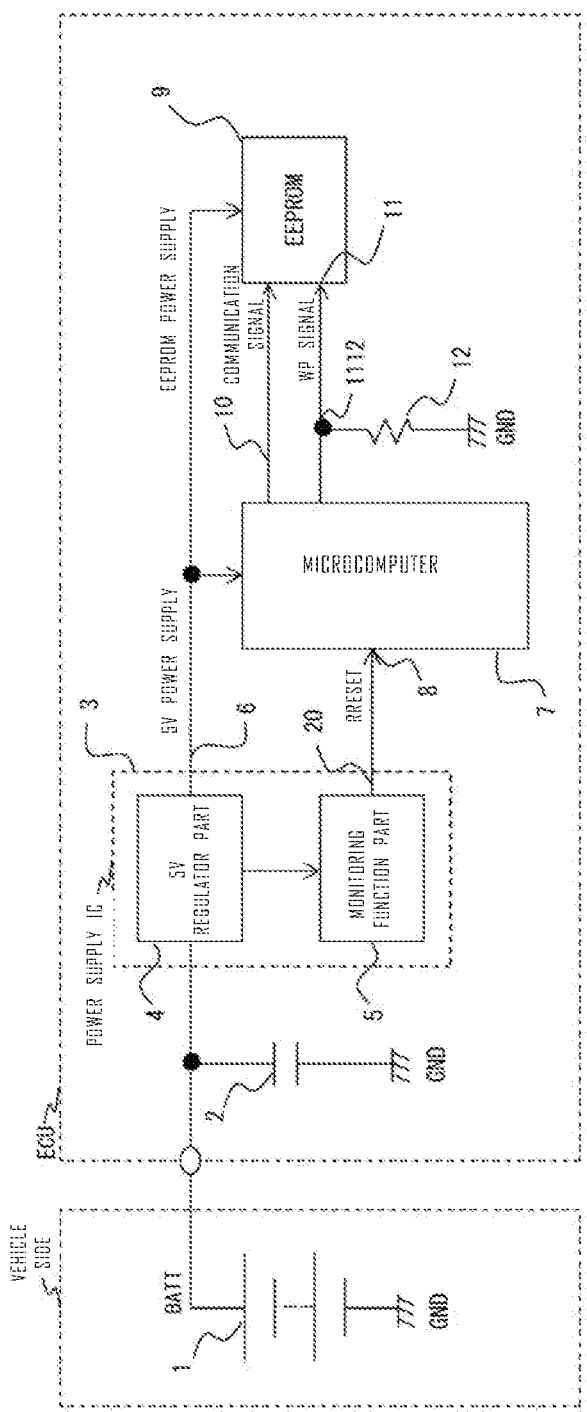
FIG. 1 is a circuit diagram showing an example of a nonvolatile memory writing device having a function of preventing garbled data in an external nonvolatile memory according to the first embodiment of the present application.
Figure 2:
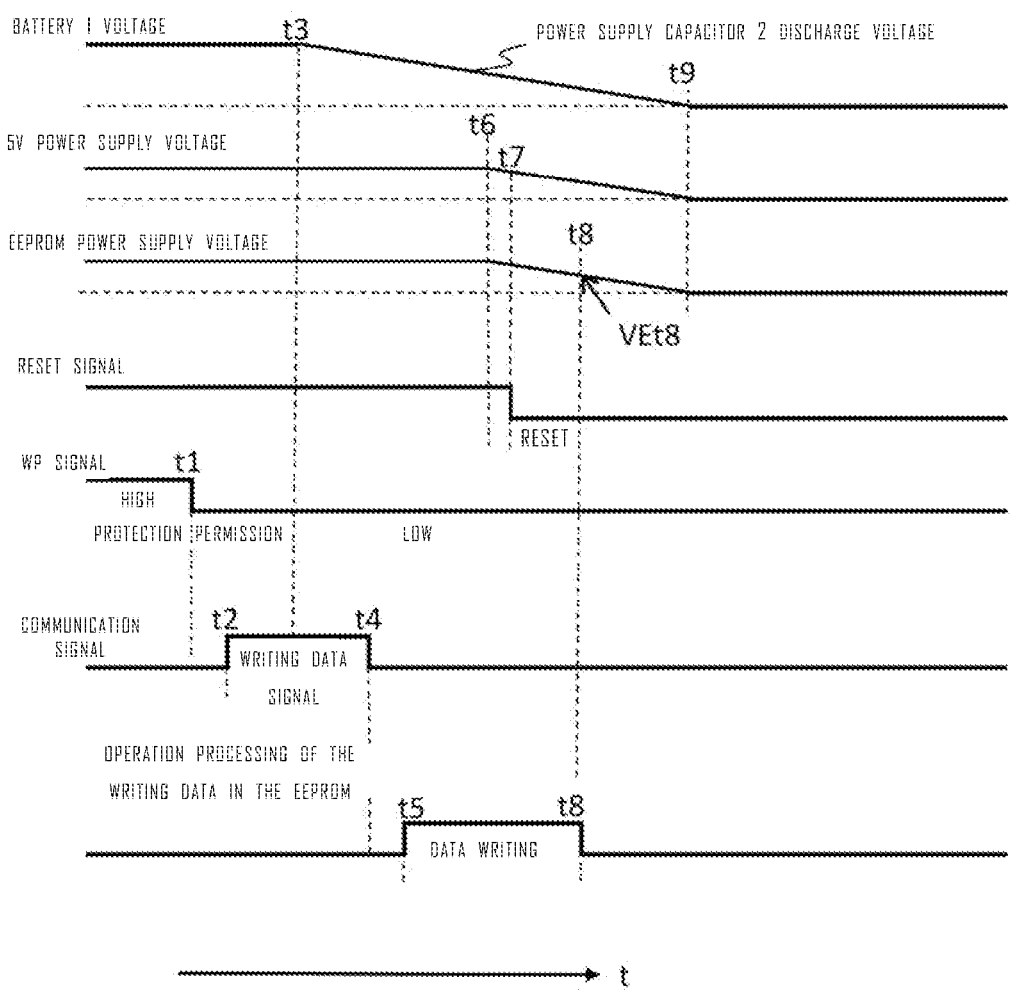
FIG. 2 is a diagram showing the relationship between voltage, signal, processing, and operating states at each point of the circuit of FIG. 1.

FIG. 1 is a circuit diagram showing an example of a nonvolatile memory writing device having a function of preventing garbled data in an external nonvolatile memory according to the first embodiment of the present application, and is an example of a circuit configuration showing the configuration of the ECU and the vehicle side according to the first embodiment of the present application. FIG. 2 is a diagram showing the relationship between voltage, signal, processing, and operating states at each point of the circuit of FIG. 1, and representing the horizontal axis as the time axis.

The ECU receives a 12V power supply from a battery 1 on the vehicle side, and a 5V power supply 6 (VCC) for control is generated by a 5V regulator part 4 in a power supply IC 3 provided in the ECU. A microcomputer 7 is started by receiving the power supply from the 5V power supply 6 of the power supply IC 3, for example, it detects a signal such as a sensor from the vehicle side and outputs a signal such as ignition or fuel injection, according to the run state of the vehicle.

The power supply circuit of the ECU has a power supply capacitor 2 for smoothing the voltage supplied from the battery 1 on the vehicle side.

In addition to the memory inside the microcomputer 7 (not shown), an external nonvolatile memory (hereinafter referred to as "EEPROM 9") 9 formed on the integrated circuit IC outside the microcomputer is provided.

EEPROM is an abbreviation for Electronic Erasable Programmable Read Only Memory, and the EEPROM 9 is provided for failure information in the ECU and other recordings.

As for the microcomputer 7, the EEPROM 9 is launched by receiving power supply from the 5V power supply 6 which is the output of the 5V regulator part 4 of the power supply IC 3. The external nonvolatile memory has a write-protect terminal (hereinafter abbreviated as "WP terminal") 11, by setting the control signal, which is a write protection signal to a WP terminal 11 (hereinafter abbreviated as "WP signal") to low (that is, disabling write protection), it allows writing of write data signals into the EEPROM 9.

In the microcomputer 7, by setting to low the WP terminal 11, in other words, after setting the WP terminal 11 to the disabled state of writing protection (write permission state), by transmitting a write data signal (failure information in the vehicle electronic control unit ECU, other data) by a communication signal 10, by rewriting the data in the EEPROM 9, for example, vehicle-related recorded data such as vehicle driving time, failure information, are recorded in the EEPROM 9.

The power supply IC 3 has a monitoring function part 5, and when the monitoring function part 5 detects an abnormality such as a voltage drop of the 5V power supply 6, a reset signal 20 is transmitted to a reset terminal 8 of a microcomputer 7 to stop the operation of the microcomputer 7.

A connection point 1112 between the microcomputer 7 and the WP terminal 11 of the EEPROM 9 is connected to the negative side of the power supply (5V power supply 6) of the microcomputer 7 via a resistance 12, in other words, connected to a ground GND. As a result, when the WP writing output from the microcomputer 7 stops (high impedance) due to the reset of the microcomputer 7, the WP terminal 11 becomes the ground potential and becomes low, write protection is disabled and the EEPROM 9 is write-enabled.

In the configuration of the first embodiment, when the voltage of the battery 1 is cut off or dropped due to some factor, as illustrated in FIG. 2, the voltage of the power supply (5V power supply 6, EEPROM power supply) in the ECU begins to gradually decrease due to the discharge of the power supply capacitor 2 in the ECU, when the voltage drops by a certain level or more, the monitoring function part 5 in the power supply IC 3 sends a reset signal 20 to the reset terminal 8 of the microcomputer 7, and the microcomputer 7 is reset.

When trying to write failure information or other recording data from the microcomputer 7 to the EEPROM 9, when the reset signal 20 is generated after the writing data is transmitted from the microcomputer 7 to the EEPROM 9, since the WP terminal 11 of the EEPROM 9 is already fixed at low (at the state of permission), data can be written as long as the EEPROM 9 can operate.

Second Embodiment

The second embodiment will be described with reference to a circuit diagram, using an electronic control device (hereinafter abbreviated as "ECU") for electronic engine control as an example.

In the first embodiment, the configuration in which the EEPROM 9 is operated by the power supply capacitor 2 of the ECU is illustrated, in the second embodiment, a power supply dedicated to the EEPROM 9, in other words, a power supply dedicated to the external nonvolatile memory is provided, the operating time of the EEPROM 9, in other words, the data recording time of the external nonvolatile memory can be extended.

Figure 3:
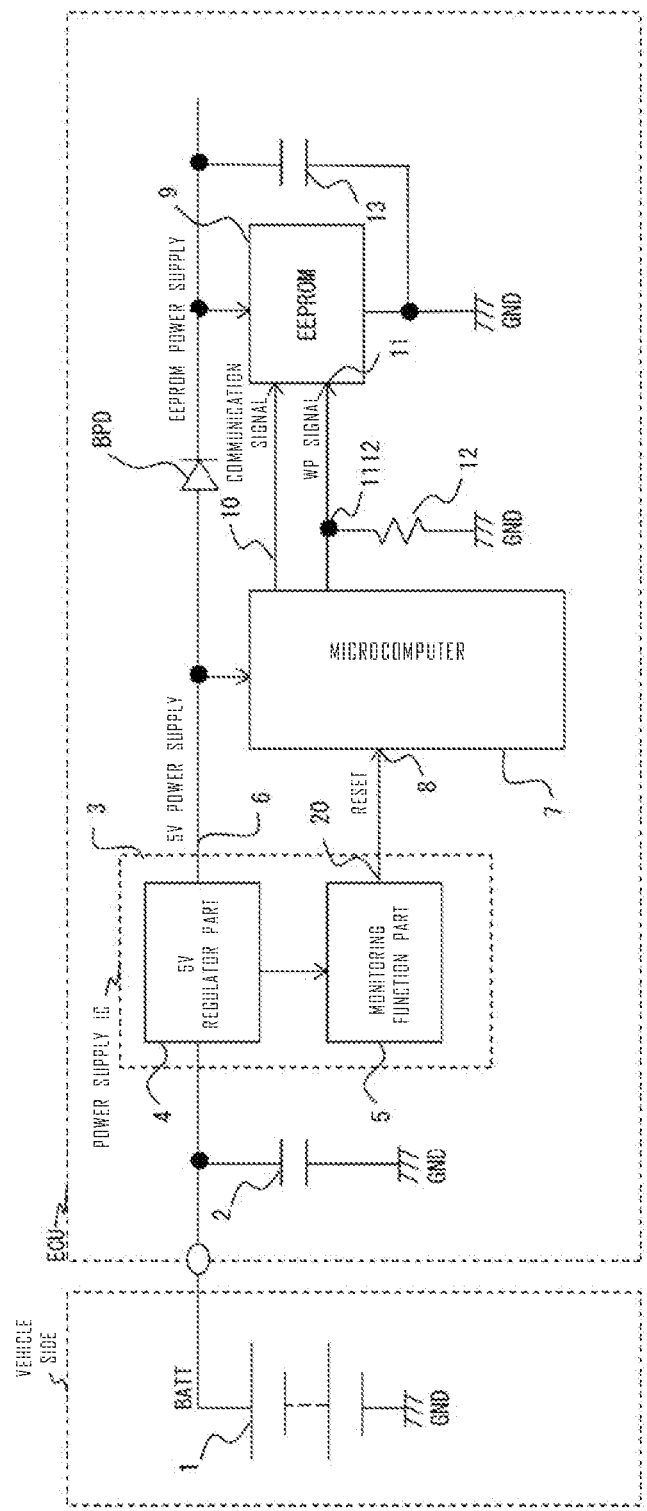
FIG. 3 is a circuit diagram showing an example of a nonvolatile memory writing device having a function of preventing garbled data in an external nonvolatile memory according to the second embodiment of the present application.
Figure 4:
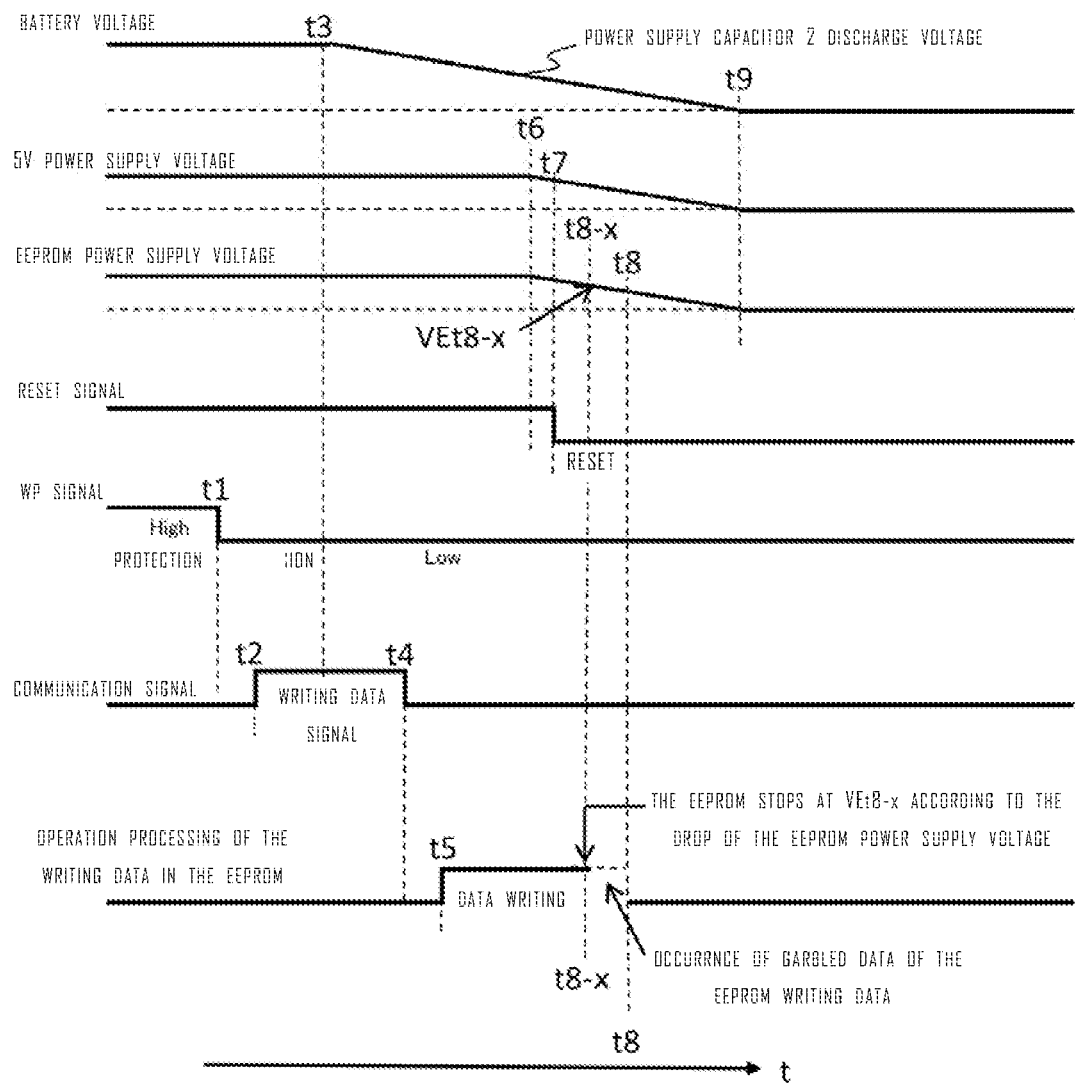
FIG. 4 is a diagram showing the relationship of the voltage, the signal, the processing and the state of operation at each point in the circuit of FIG. 1, and illustrating an example of a problem that can be considered in the case of the first embodiment only.
Figure 5:
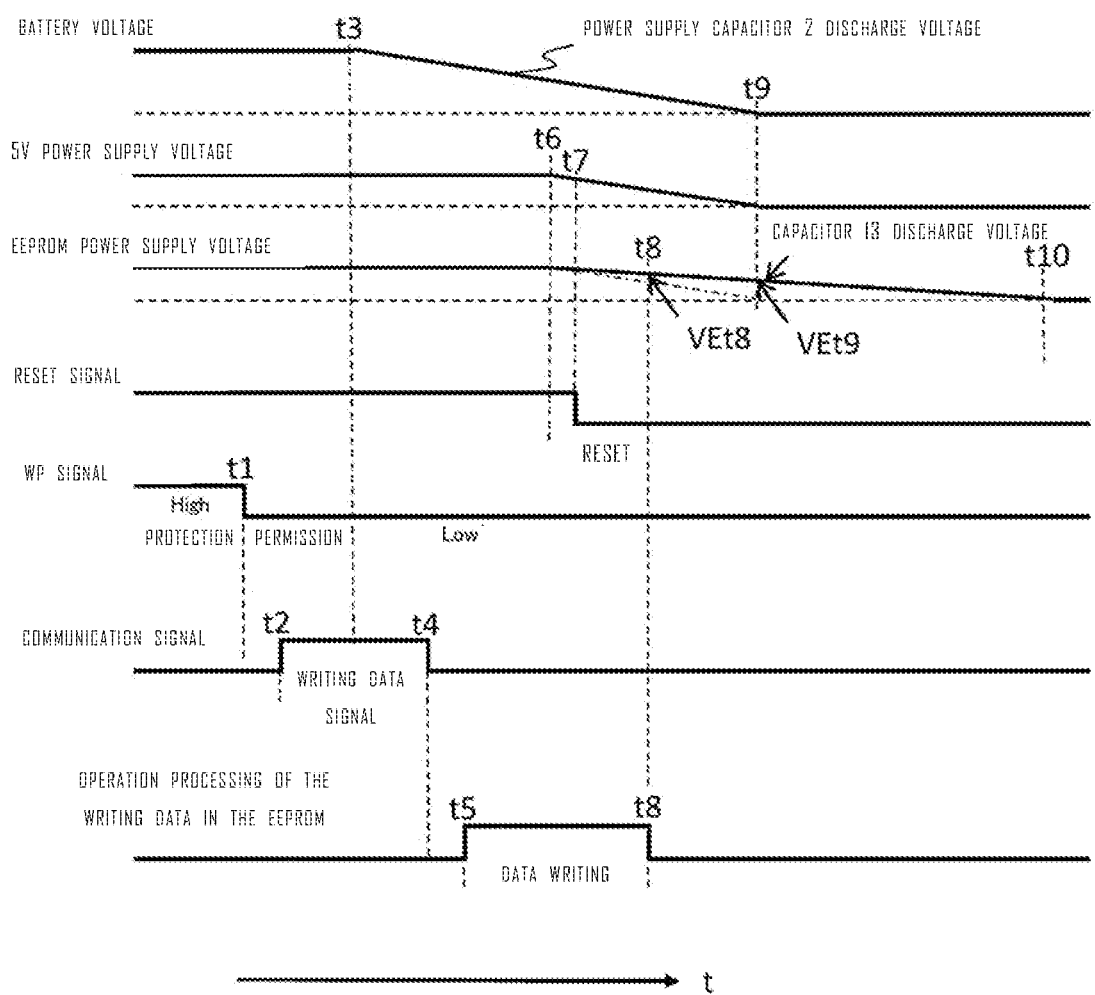
FIG. 5 is a diagram showing the relationship between voltage, signal, processing, and operating states at each point of the circuit of FIG. 1.

FIG. 3 is a circuit diagram showing an example of a nonvolatile memory writing device having a function of preventing garbled data in an external nonvolatile memory according to the first embodiment of the present application, and is an example of a circuit configuration showing the configuration of the ECU and the vehicle side. FIG. 4 is a diagram showing the relationship of the voltage, the signal, the processing and the state of operation at each point in the circuit of FIG. 1 of the first embodiment of the present application, and illustrating an example of a problem that can be considered in the case of the first embodiment only. FIG. 5 is a diagram showing the relationship between voltage, signal, processing, and operating states at each point of the circuit of FIG. 1.

In the second embodiment of the present application, as illustrated in FIG. 3, a power supply capacitor 13 is separated from the power supply capacitor 2, the 5V power supply generated by the 5V regulator part 4 in the power supply IC 3 is used as an auxiliary power supply for the EEPROM 9, and in other words, the power supply capacitor 13 which is a dedicated power supply for the EEPROM 9 is provided outside the nonvolatile memory 9, and electric charges are stored in this capacitor 13.

Further, as illustrated in FIG. 3, when the voltage of the battery 1 which is the power source of the ECU drops, a diode BPD for preventing reverse flow is connected between the microcomputer 7 and the EEPROM 9 in the positive power supply line of the 5V power supply 6 so that the electric charge of the capacitor 13 for the EEPROM and other charges does not flow out to the microcomputer 7.

In the first embodiment, if the power supply capacitor 2 of the ECU is discharged while the data of the EEPROM 9 is being written, the EEPROM 9 may stop operating and data may be garbled, regarding the time required for the EEPROM 9 to write data, it is possible to prevent the occurrence of garbled data due to the shutdown of EEPROM 9 during data writing, by continuing to supply power from the EEPROM capacitor 13.

In FIGS. 2, 4 and 5, the horizontal axis is the time axis and the vertical axis is the vertical axis, the operation of the voltage of the battery 1 of FIGS. 1 and 3, the voltage of the 5V power supply, the voltage of the EEPROM power supply, the reset signal, the WP signal, the communication signal, and the data writing process in the EEPROM are illustrated.

Hereinafter, the operations of FIGS. 2, 4 and 5 will be described below.

First, the operation leading to the operation of the data writing process to the EEPROM 9 will be described with reference to FIG. 2, which is a diagram showing the relationship between voltage, signal, and state of the processing operation at each point of the circuit of FIG. 1.

In FIG. 2, when the WP signal changes from high (High (write-protected)) to low (Low (write-enabled (writing protection disabled))) at the point of time t1, At the point of time t2, transmission of data signals (failure information, other data) by communication signals from microcomputer 7 to EEPROM 9 begins, if the voltage of the battery 1 is cut off at the point of time t3 for some reason, the voltage of the power supply IC 3 (voltage of the battery 1) due to the discharge of the power supply capacitor 2 will reach the point of time t4 before it becomes zero at the point of time t9, data signals (failure information, other recorded data) by communication signals are continuously transmitted from the microcomputer 7 to the EEPROM 9.

Since the WP signal remains low (low (write-enabled (writing protection disabled))), the operation of writing the recorded data to the EEPROM 9 starts at the point of time t5.

At the point of time t6, the voltage of the 5V power supply and the voltage of the EEPROM power supply begin to drop due to the voltage drop of the battery 1, at the point of time t7, the reset signal 20 to the microcomputer 7 is generated, if the EEPROM power supply voltage VEt8 at the point of time t8 is greater than the EEPROM 9 starting state maintenance voltage Vessm, the operation of the data writing process in the EEPROM is continuously performed from the point of time t5 to the point of time t8, the data writing process in the EEPROM is completed.

From a different point of view, even if the reset signal 20 to the microcomputer 7 is generated while writing the data to the EEPROM 9, if the power supply voltage of the EEPROM 9 is sufficient to maintain the starting state of the EEPROM 9, it is possible to continue writing data to the EEPROM 9.

Then, the operation leading to the operation of the data writing process to the EEPROM 9 will be described with reference to FIG. 4, which shows the problems that can be considered in the case of the first embodiment only, and which is a diagram showing the relationship between voltage, signal, and state of the processing operation at each point of the circuit of FIG. 1.

In FIG. 4, each operation from the point of time t1 to the point of time t7 is the same as in FIG. 2, so the description of the operation is omitted.

In FIG. 4, when the degree of decrease in the voltage of the battery 1 is larger than the degree of decrease in FIG. 2, for example, if the voltage VEt8-$x$ of the EEPROM power supply at the point of time t8-$x$ becomes lower than the starting state maintenance voltage VEssm of the EEPROM 9, it is conceivable that data writing to the EEPROM 9 that started at the point of time t5 will stop at point of time t8-$x$ without continuing until point of time t8.

If data writing to the EEPROM 9 is stopped at the point of time t8-x without continuing until the point of time t8, the write data recorded in the EEPROM 9 may be garbled, it is preferable that the voltage VEt8 of the EEPROM power supply becomes larger than the starting state maintenance voltage VEssm of the EEPROM 9 until the point of time t8 is exceeded.

Then, the operation leading to the operation of the data writing process to the EEPROM 9 will be described with reference to FIG. 5, which is a diagram showing the relationship between voltage, signal, processing and operation states at each point of the circuit of FIG. 3.

In FIG. 5, each operation from the point of time t1 to the point of time t6 is the same as in FIG. 2, so the description of the operation is omitted.

At the point of time t6, when the power supply voltage of the EEPROM 9 begins to drop, the discharge of the capacitor (dedicated power supply of the EEPROM 9) 13 in which the charge is accumulated by the microcomputer power supply (5V power supply) 6 causes the discharge, for example, even if the voltage of the microcomputer power supply (5V power supply) 6 at the point of time t9 is zero, the voltage of the power supply of the EEPROM 9 at the point of time t9 is the voltage Vet9, the power supply voltage of the EEPROM 9 becomes zero at point of time t10 when it exceeds the point of time t9, but the voltage VEt8 of the EEPROM power supply at the point of time t8 before the point of time t9 can secure a voltage sufficiently higher than the starting state maintenance voltage VEssm of the EEPROM 9, the operation of the data writing process in the EEPROM is continuously and surely performed from the point of time t5 to the point of time t8, and the data writing process in the EEPROM is completed.

From a different point of view, even if the microcomputer 7 is reset while writing data to the EEPROM 9, the capacitor 13, which is a dedicated power supply for the EEPROM 9, allows the EEPROM 9 to continue to be in the starting state until the data writing to the EEPROM 9 is completed.

In other words, the capacitor 13, which is a power supply dedicated to the EEPROM 9, is an EEPROM starting state maintenance voltage compensation capacitor for compensating the starting state maintenance voltage of the EEPROM 9 for a predetermined time, further, it is an EEPROM dedicated power supply for compensating the starting state maintenance voltage of the EEPROM 9 for a predetermined time.

Third Embodiment

The third embodiment will be described below with reference to FIGS. 6 and 7 by taking the ECU as an example.

Figure 6:
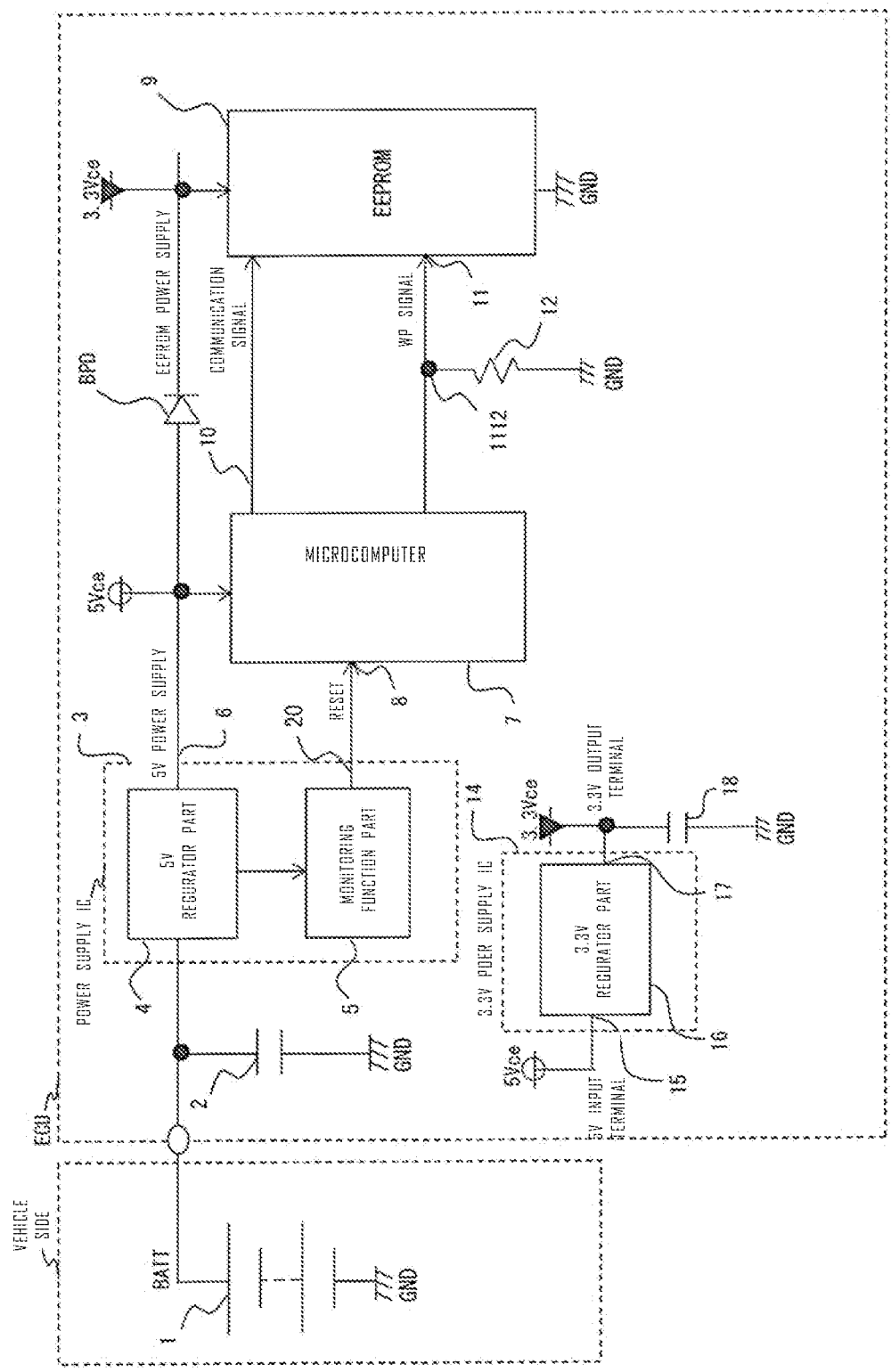
FIG. 6 is a circuit diagram showing an example of a nonvolatile memory writing device having a function of preventing garbled data in an external nonvolatile memory according to the third embodiment of the present application.
Figure 7:
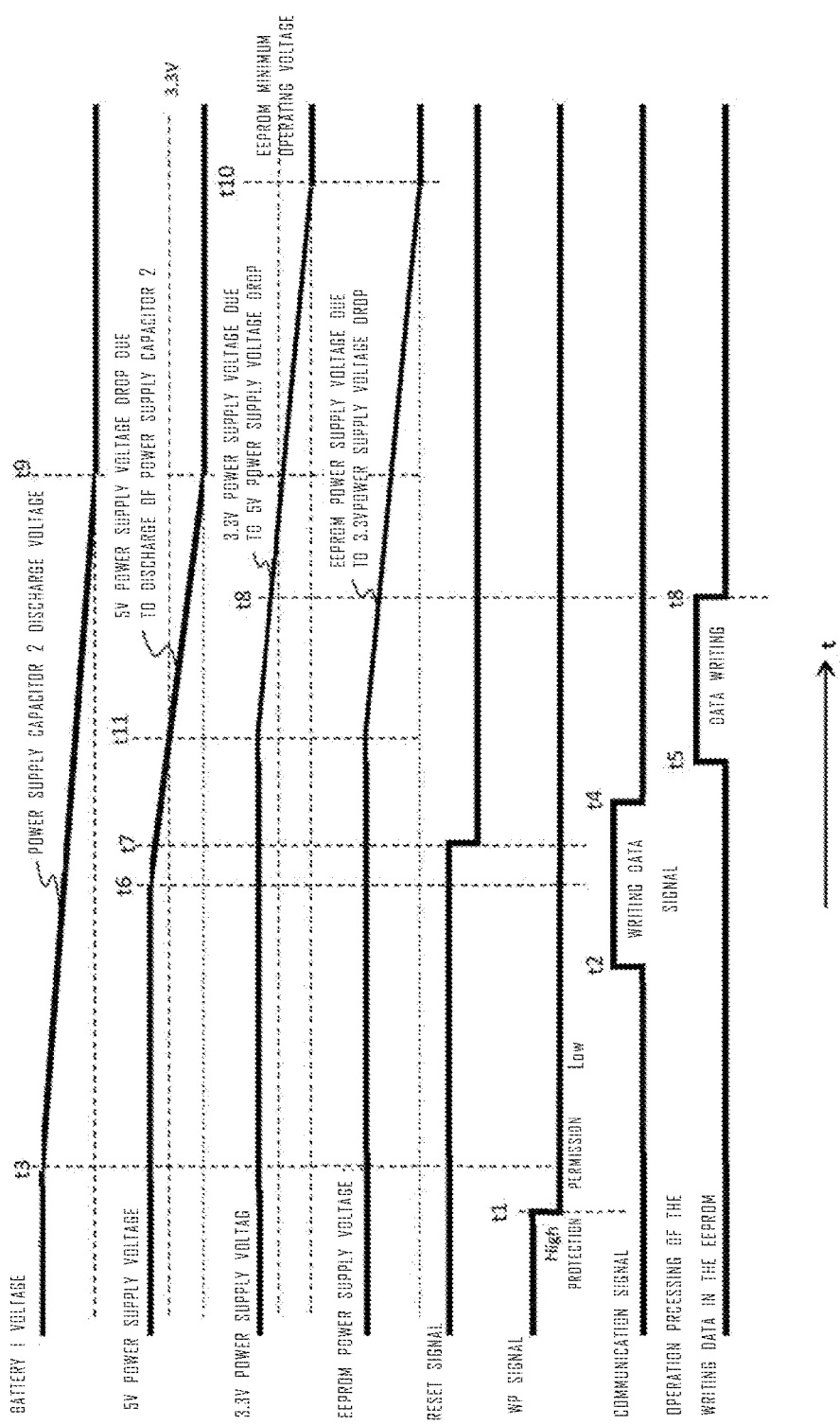
FIG. 7 is a diagram showing the relationship between voltage, signal, processing, and operating states at each point of the circuit of FIG. 6 according to the third embodiment of the present application.

In the second embodiment, the dedicated power supply of the EEPROM 9 is the capacitor 13, but as illustrated in FIGS. 6 and 7, the circuit configuration is such that a power supply dedicated to EEPROM 9 is separately generated inside the ECU, the data recording time of the EEPROM 9 can be extended even without the capacitor 13 illustrated in the second embodiment, therefore, as in the second embodiment, it is possible to prevent the occurrence of garbled data due to the shutdown of the EEPROM 9 during data writing.

In the third embodiment, the dedicated power supply of the EEPROM 9 is a 3.3V power supply as an example.

FIG. 6 is an example of a circuit configuration showing the configuration inside the ECU and the configuration on the vehicle side according to the third embodiment of the present application. FIG. 7 is a diagram showing the state of operation of the voltage or processing at each point in FIG. 6.

As illustrated in FIG. 6, in the third embodiment, the 3.3V power supply generated by a power supply IC 14 that generates 3.3V equal to or higher than the minimum operating voltage of the EEPROM 9 is used as the power supply dedicated to the EEPROM 9.

The 3.3V power supply IC 14 converts the 5V voltage input from a 5V input terminal 15 connected to a connection terminal 5Vce, which is the connection terminal of the 5V power supply, to the 3.3V voltage by an internal 3.3V regulator part 16, and is an IC that outputs a 3.3V voltage from a 3.3V output terminal 17.

The 5V input terminal 15 of the 3.3V power supply IC 14 is connected to the 5V power supply 6 of the microcomputer 7 via a connection terminal 5Vce.

The 3.3V output terminal 17 of the 3.3V power supply IC 14, in other words, the 3.3V output terminal 17 of the 3.3V regulator part 16, is connected to the positive power supply side connection line of the EEPROM 9 via a connection terminal 3.3Vce, which is the 3.3V connection terminal. Further, the 3.3V output terminal 17 is grounded to the ground GND of the negative power supply via an output stabilizing capacitor 18 as the EEPROM power supply.

In FIG. 6 illustrated in the third embodiment, as is apparent from the above description and FIG. 6, the 3.3V power supply generated by the power supply IC 14 that generates 3.3V, which is equal to or higher than the minimum operating voltage of the EEPROM 9, is added to FIG. 1 as an example in the first embodiment as a power supply dedicated to the EEPROM 9.

The larger the capacity of the output stabilization capacitor 18 is, the more stable the output of the 3.3V output terminal 17 is.

In the first embodiment, if the power supply capacitor 2 of the ECU is discharged while the data of the EEPROM 9 is being written, the EEPROM 9 may stop operating and data may be garbled, in the third embodiment, the output stabilization capacitor 18 of the 3.3V power supply IC 14, in other words, the output stabilization capacitor 18 of the 3.3V regulator part 16 is used, since the EEPROM 9 can continue to be powered for the time required for the EEPROM 9 to write data, the occurrence of garbled data due to the shutdown of the EEPROM 9 during data writing is prevented.

Then, the operation leading to the operation of the data writing process to the EEPROM 9 will be described with reference to FIG. 7, which is a diagram showing the relationship between voltage, signal, processing and operation states at each point of FIG. 6. In FIG. 6, each operation from the point of time t1 to the point of time t8 in FIG. 7 is the same as each operation in the case of FIG. 1, from the point of time t1 to the point of time t8 in FIG. 2, so the description of the operation is omitted.

In FIG. 7, when the output voltage of the 5V power supply 6 drops from the point of time t6 and the output voltage falls below 3.3V as shown in the point of time t11, the output voltage of the 3.3V output terminal 17 of the 3.3V power supply IC 14 starts to drop.

Since the output stabilization capacitor 18 is connected to this 3.3V output terminal 17, the drop in the output voltage of the 3.3V output terminal 17 becomes gradual, when the output voltage of the 3.3V output terminal 17 drops to the starting state maintenance voltage VEssm of the EEPROM 9, it is slower than when the output stabilization capacitor 18 is not provided. As a result, the starting state of the EEPROM 9 can be continued until the data writing to the EEPROM 9 is completed.

Fourth Embodiment

The fourth embodiment will be described below with reference to the circuit diagram using the ECU as an example.

In the second and third embodiments, by providing a power supply dedicated to the EEPROM 9, it is possible to write to the EEPROM 9 for a certain period of time even when the power is turned off, but it is also possible to write to the EEPROM 9 when, for example, a microcomputer reset occurs due to noise.

In the fourth embodiment, a circuit having a function of determining write protection/permission of the WP terminal according to the fluctuation of the power supply voltage is added, writing to the EEPROM can be prohibited when noise occurs, therefore, it is possible to prevent the EEPROM data from being garbled due to noise.

Figure 8:
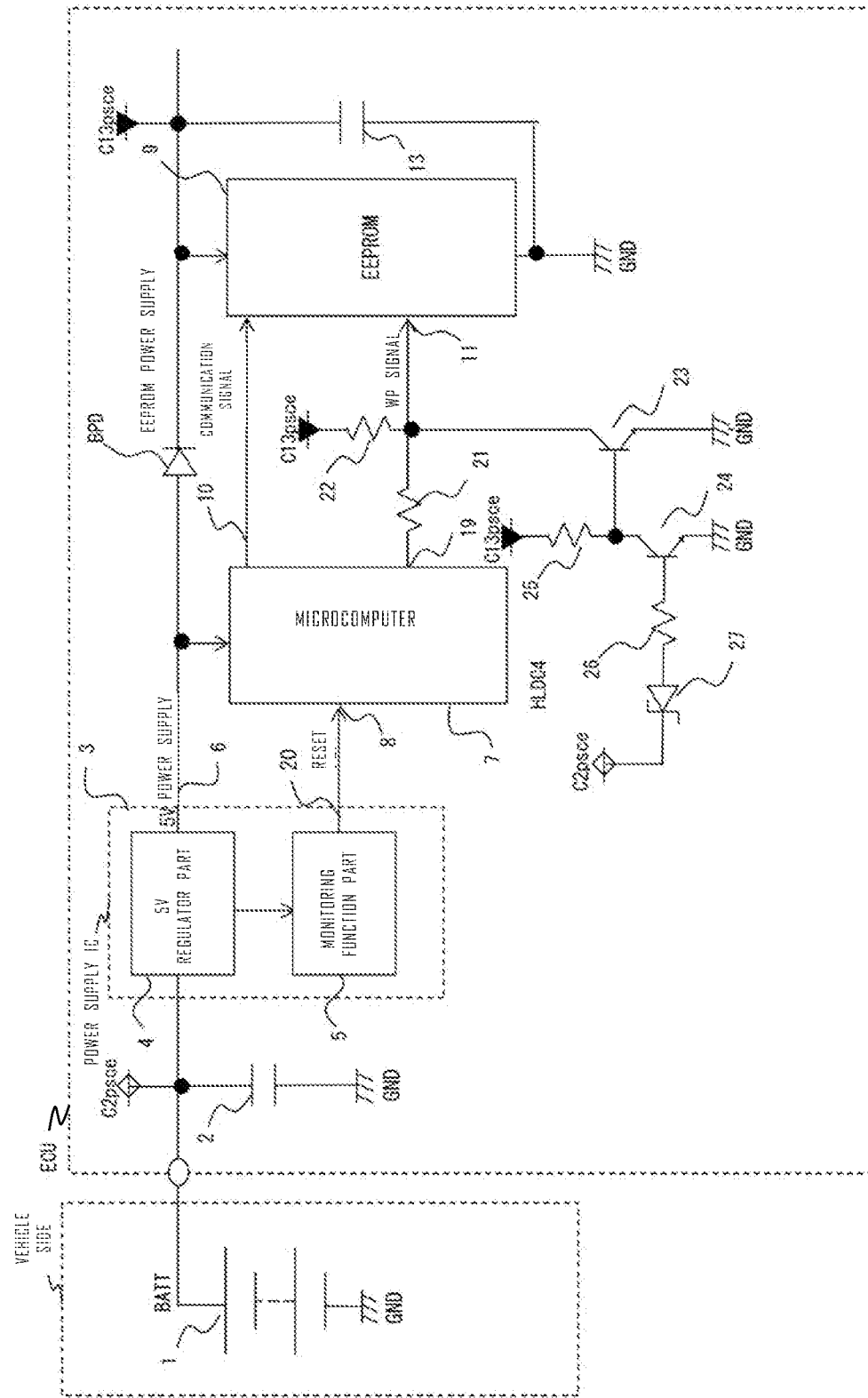
FIG. 8 is a circuit diagram showing an example of a nonvolatile memory writing device having a function of preventing garbled data in an external nonvolatile memory according to the fourth embodiment of the present application.
Figure 9:
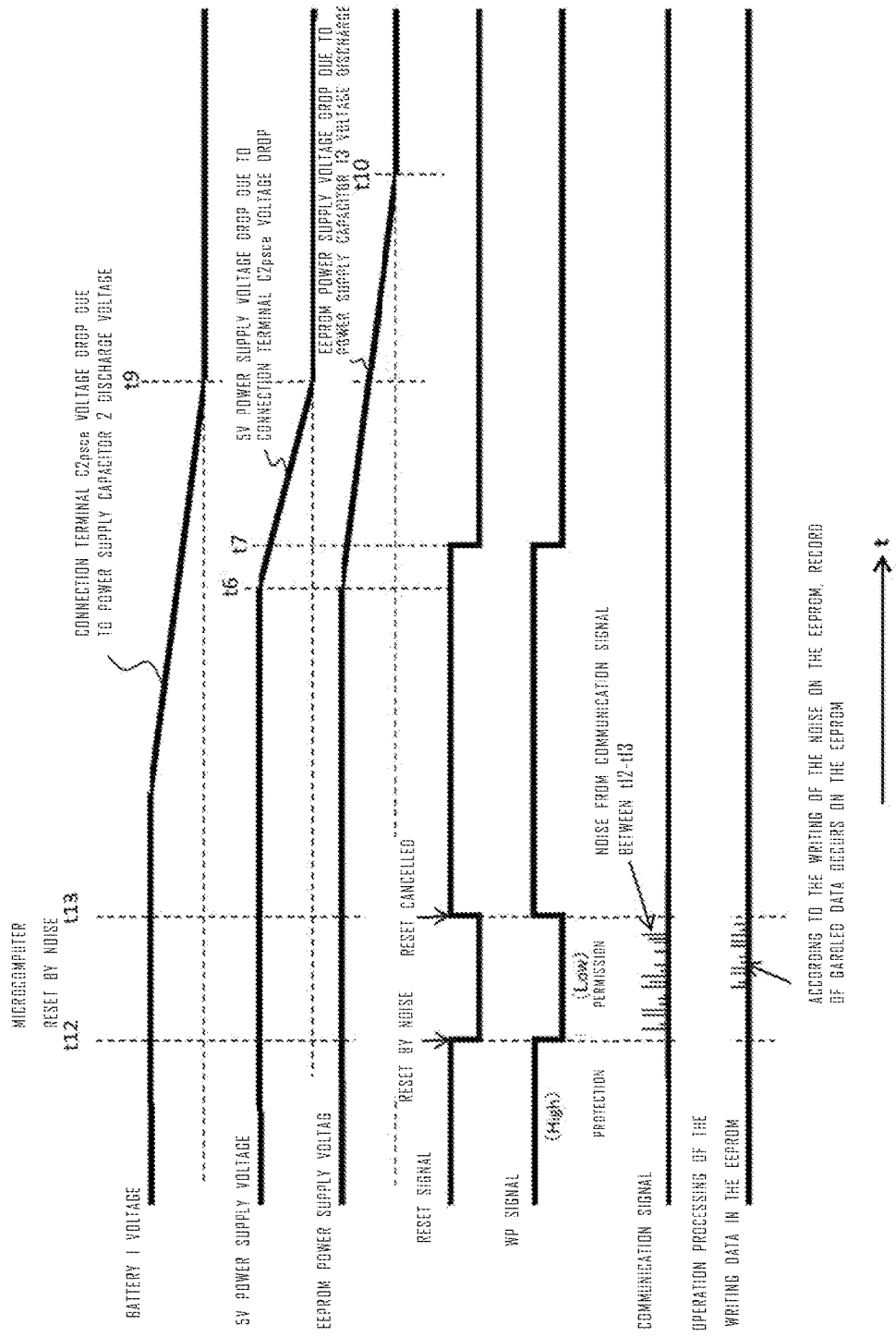
FIG. 9 is a diagram showing the relationship of the voltage, the signal, the processing and the state of operation at each point in the circuit of FIG. 6 according to the third embodiment of the present application, and illustrating an example of a problem that can be considered in the case of the second to third embodiments.
Figure 10:
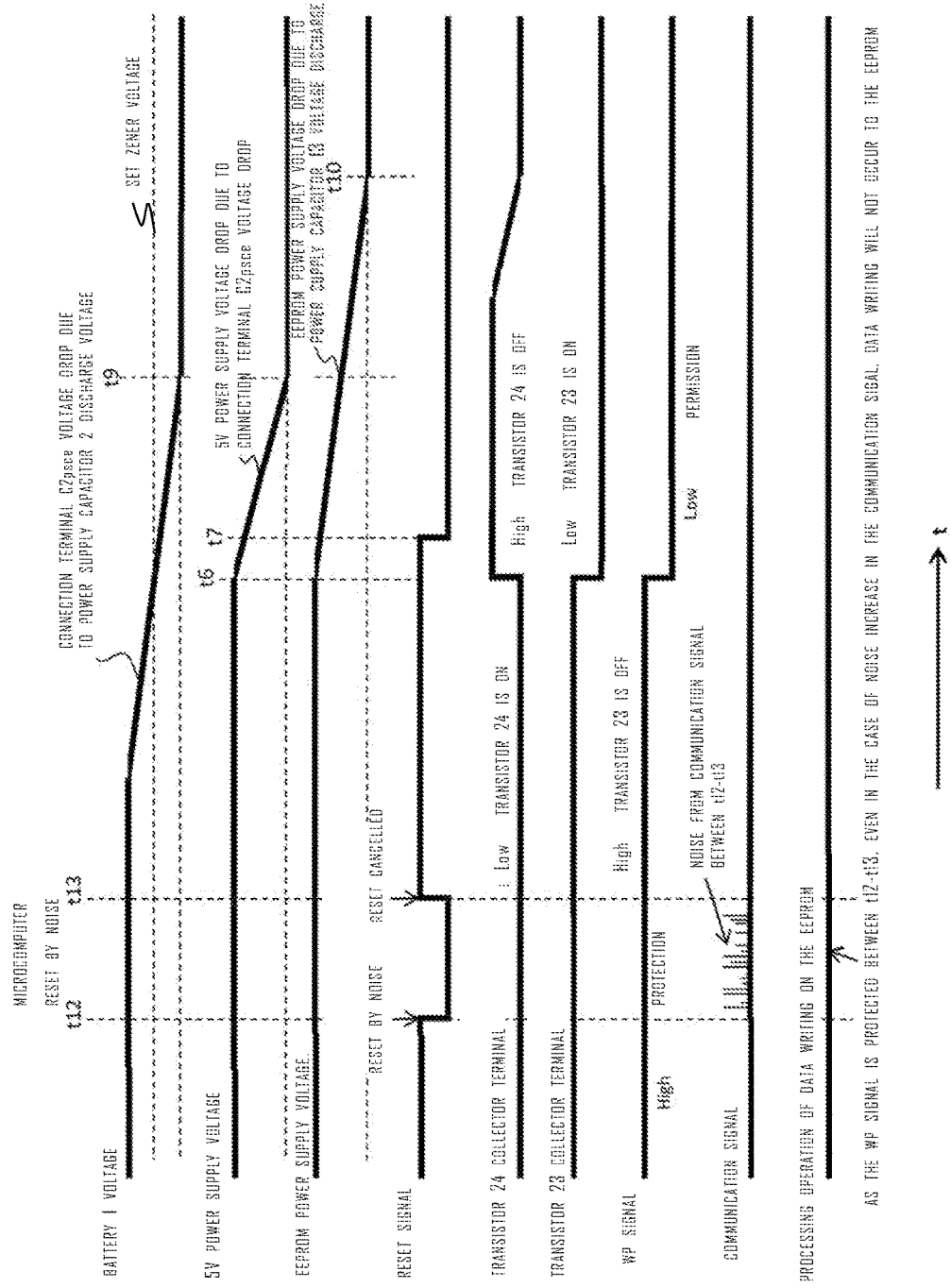
FIG. 10 is a diagram showing the relationship between voltage, signal, processing, and operating states at each point of the circuit of FIG. 8 according to the fourth embodiment of the present application.

FIG. 8 is a circuit diagram showing an example of a nonvolatile memory writing device having a function of preventing garbled data in an external nonvolatile memory according to the fourth embodiment of the present application, and is an example of a circuit configuration showing the configuration of the ECU and the vehicle side. FIG. 9 is a diagram showing the relationship of the voltage, the signal, the processing and the state of operation at each point in the circuit of FIG. 6 according to the third embodiment of the present application, and illustrating an example of a problem that can be considered in the case of the second to third embodiments, and FIG. 10 is a diagram showing the relationship between voltage, signal, processing, and operating states at each point of the illustrated circuit in FIG. 8.

As illustrated in FIG. 8, a resistance 21 is connected between a WP terminal 19 of the microcomputer 7 and the WP terminal 11 of the EEPROM 9. The other terminal of a resistance 22 to which one terminal is connected between the resistance 21 and the WP terminal 11 of the EEPROM 9 is connected to the positive electrode side power line of the capacitor 13, which is a power source dedicated to the EEPROM 9, via a connection terminal C13*psce* of the power line on the positive electrode side of the capacitor 13.

Further, the resistance 21 and the WP terminal 20 of the EEPROM 9 are connected to the collector terminal of a transistor 23, and the emitter terminal of the transistor 23 is grounded. The base terminal of the transistor 23 is connected to the collector terminal of a transistor 24. The other terminal of a resistance 25 connected to one terminal to the base terminal of the transistor 23 and the collector terminal of the transistor 24, is connected to the positive power line of the capacitor 13 that compensates for the decrease in the power supply voltage of the EEPROM for a predetermined time, via the connection terminal C13*psce* of the positive power line of the capacitor 13. The emitter terminal of the transistor 24 is grounded, and the base terminal of the transistor 24 is connected to the anode terminal of a zener diode 27 via a resistance 26. The cathode terminal of the zener diode 27 is connected to the positive power supply line of the power supply capacitor 2 via a connection terminal C2*psce* of the positive power supply line of the power supply capacitor 2 of the ECU.

Further, in FIG. 8 illustrated in the fourth embodiment, as is apparent from the above description and FIG. 8, a decision circuit HLDC4 for protection/permission with noise support, composed of the resistance 21, the resistance 22, the transistor 23, the transistor 24, the resistance 25, the resistance 26, and the zener diode 27, is an example added to FIG. 3 as an example in the above-mentioned second embodiment. Therefore, even in the fourth embodiment illustrated in FIG. 8, the same operation as in the second embodiment described above can be performed, as in the case of the second embodiment, when the power supply voltage drops abnormally, the starting state maintenance voltage of the EEPROM 9 can be secured, so that the recorded data of the EEPROM 9 is not garbled.

In the second embodiment described above, the noise causes the reset of the microcomputer 7 illustrated in FIG. 3 to occur. When the WP writing output of the microcomputer 7 stops (high impedance) due to the reset of the microcomputer 7, the WP terminal 11 is fixed to low (permission), and the EEPROM 9 is write-enabled. At this time, if a noise signal is added to the communication signal 10, abnormal writing is performed to the EEPROM 9, and the data of the EEPROM 9 is garbled.

In the fourth embodiment, when noise is generated, as the positive power supply side of the power supply capacitor 2 of the ECU has a high potential equal to or higher than the set zener voltage of the zener diode, the voltage of the cathode terminal of the zener diode 27 becomes higher than the zener voltage, and the zener diode 27 conducts. When the zener diode 27 conducts, the transistor 24 conducts (ON) via the resistance 26. When the transistor 24 is conducted (ON), the base potential of the transistor 23 becomes the ground potential, so that the transistor 23 becomes non-conducted (OFF). At this time, the microcomputer is reset due to noise, so the output of the WP terminal 19 of the microcomputer 7 is stopped (high impedance), but the WP terminal 11 does not become low, the resistance 22 makes the potential equal to that of the connection terminal C13*psce*, so that the WP terminal 11 of the EEPROM 9 becomes high, and the EEPROM 9 becomes write-protected.

As mentioned above, when noise occurs, the positive power supply side of the power supply capacitor 2 of the ECU has a high potential equal to or higher than the set zener voltage of the zener diode, the zener diode 27 conducts, the transistor 23 becomes non-conducted (OFF), and EEPROM 9 becomes write-protected, according to the decision circuit for protection/permission with noise support HLDC4 configured so that the WP terminal 11 of the EEPROM 9 is the potential of the connection end C13*psce*, in other words, the potential on the positive power supply side of the capacitor 13, it is possible to suppress or prevent abnormal writing to the EEPROM 9 when noise occurs.

Next, an example of a mechanism in which abnormal writing is performed to EEPROM 9 when noise occurs and an example of a mechanism in which abnormal writing is performed to EEPROM 9 when noise occurs will be described.

First, an example of a mechanism in which abnormal writing is performed to the EEPROM 9 when noise occurs will be described.

The operation leading to the operation of the data writing process to the EEPROM 9 will be described with reference to FIG. 9, which is a diagram showing the relationship between voltage, signal, processing and operation states at each point of the circuit of FIG. 3 caused by noise generation. FIG. 3 is a circuit diagram showing a nonvolatile memory writing device having a function of preventing garbled data in the external nonvolatile memory according to the second embodiment of the present application, FIG. 9 is a diagram showing the relationship of the voltage, the signal, the processing and the state of operation at each point in the circuit of FIG. 6 according to the third embodiment of the present application, and illustrating an example of a problem that can be considered in the case of the second to third embodiments.

In FIG. 9, each operation from the points of time t6, t7, t9, and t10 is the same as in FIG. 5, so the description of the operation is omitted.

When noise occurs in the section from the points of time t12 to t13, the monitoring function part 5 of the power supply IC 3 responds to the noise, outputs a reset to the microcomputer 7, and the microcomputer 7 is reset.

When the WP writing output of the microcomputer 7 stops (high impedance) due to the reset of the microcomputer 7, the WP signal is fixed to low (permission) and the EEPROM 9 is in the write permitted state. At this time, if noise is added to the communication signal 10, the EEPROM 9 misrecognizes the noise as write information and writes the noise signal of the EEPROM 9. This causes garbled data.

Next, an example of a mechanism for preventing abnormal writing to the EEPROM 9 when noise is generated will be described with reference to FIGS. 8 and 10.

FIG. 8 is a circuit diagram showing an example of a nonvolatile memory writing device having a function of preventing garbled data in an external nonvolatile memory according to the fourth embodiment of the present application, FIG. 10 is a diagram showing the relationship between voltage, signal, processing, and operating states at each point of the illustrated circuit in FIG. 8 of the fourth embodiment of the present application.

The operation leading to the operation of the data writing process to the EEPROM 9 will be described with reference to FIG. 10, which is a diagram showing the relationship between voltage, signal, processing and operation states at each point of the circuit of FIG. 8.

When noise occurs in the section from the points of time t12 to t13, the WP signal from the WP terminal 19 of the microcomputer 7 is stopped (high impedance) by resetting the microcomputer 7 as described above. At this time, since the positive power supply side of the power supply capacitor 2 of the ECU is High as described above, the zener diode 27 conducts, the transistor 24 turns on, and the transistor 23 turns off, the potential of the WP terminal 11 of the EEPROM 9 becomes the potential on the positive power supply side of the capacitor 13, which is the dedicated power supply of the EEPROM 9, and becomes high (write-protected state). At this time, even if noise is added to the communication signal 10, the WP terminal 11 of the EEPROM 9 is in a write-protected state, data is not written to EEPROM 9, and data garbled in EEPROM 9 can be prevented.

Further, as illustrated in FIG. 10, when the potential on the positive power supply side of the power supply capacitor 2 begins to decrease due to the same cause as in the above-described first embodiment, the zener diode 27 becomes non-conducting at the point of time t6, the transistor 24 is turned off and the collector potential of the transistor 24 is high. When the collector potential of the transistor 24 becomes high, the transistor 23 becomes on, and the WP terminal 11 of the EEPROM 9 becomes the ground GND potential and becomes low (write permission state). Therefore, when the potential on the positive power supply side of the power supply capacitor 2 begins to drop, until the potential on the positive power supply side of the capacitor 13, which is the dedicated power supply for EEPROM 9, drops below the starting state maintenance voltage of the EEPROM 9, it is possible to write the recorded data transmitted by the communication signal 10 to the EEPROM 9.

In the case of the fourth embodiment, a watchdog timer is used to monitor the presence or absence of noise. As a specific example, a watchdog signal, for example, a 5 ms square wave, is transmitted from the microcomputer 7 to the power supply IC 3 in order to confirm that the microcomputer 7 is normal. When the microcomputer 7 operates out of normal operation due to noise, the watchdog signal outputs a signal different from the 5 ms square wave. The monitoring function part 5 of the power supply IC 3 constantly monitors the watchdog signal, and when the watchdog signal outputs a signal different from the 5 ms square wave, the monitoring function part 5 of the power supply IC 3 transmits a reset signal to the microcomputer 7. In other words, the monitoring function part 5 outputs a reset signal to the microcomputer 7 based on the noise monitoring result. As described above, even if noise is added to the communication signal 10, the WP terminal 11 of the EEPROM 9 is in a write-protected state, data is not written to EEPROM 9, and data garbled in EEPROM 9 can be prevented. An example was shown in which a watchdog timer for monitoring the status of the microcomputer 7 is provided in the microcomputer 7, but even if the watchdog timer is installed outside the microcomputer 7, the same effect as described above can be expected.

The noise referred here is assumed to be noise generated when the regulator of the vehicle operates, or noise generated at the timing when the ignition coil operates, during normal operation, these noises are temporary, with the frequency and level of noise generation change depending on the operating speed of the engine. The generated noise propagates in the air and is transmitted to a microcomputer, which causes a malfunction.

Since the remaining functions and operations of FIGS. 8 and 10 of the fourth embodiment are the same as the functions and operations of FIGS. 3 and 5 of the above-described second embodiment, the description thereof will be omitted.

The decision circuit for protection/permission with noise support HLDC4 in the fourth embodiment is triggered by the potential on the positive power supply side of the power supply capacitor 2, in other words the power supply voltage of the battery 1, it is an example of responding to fluctuations in the potential on the positive power supply side of the power supply capacitor 2, the decision circuit for protection/permission with noise support HLDC4 can obtain the same effect by responding to the voltage fluctuation of the power supply by using the 5V power supply 6 or the 3.3V power supply (see FIG. 6) as a trigger.

Fifth Embodiment

The fifth embodiment will be described below with reference to the circuit diagram using the ECU as an example.

As described above, in the fourth embodiment, the decision circuit for protection/permission with noise support HLDC4 for writing to the EEPROM 9 is configured to respond to fluctuations in the positive power supply side potential of the power supply capacitor 2 by using the positive power supply side potential of the power supply capacitor 2 of the ECU as a trigger.

In the fifth embodiment, the power supply exemplified in the fourth embodiment (potential on the positive power supply side of the power supply capacitor 2) and the reset signal 20 from the 5V power supply IC 3 to the microcomputer 7 are used as a trigger for a circuit HLDC5, which determines whether to prohibit microcomputer abnormalities for writing to the EEPROM 9.

It is possible to prevent in the fifth embodiment the "Unexpected runaway of the microcomputer caused by some external factor (Unexpected runaway here is not a temporary malfunction of the microcomputer due to noise, but it is a well-known runaway (microcomputer abnormality) such as thermal runaway of the microcomputer in the ECU due to the use of the vehicle in a high temperature environment, for example, due to unintended movement (for example, unexpected abnormal movement such as continuous output of high) by all or any of the terminals of the microcomputer, during the writing process of the EEPROM 9, that is, during the writing process, the WP terminal 20 of the EEPROM 9 becomes high and the write-protected state to the EEPROM 9 causes garbled data." that could not be dealt with in the above-mentioned fourth embodiment.

In the fifth embodiment, as an example, an example is shown in which the voltage of the 5V power supply 6 and the reset signal 20 to the reset terminal 8 are used as a trigger of the decision circuit for protection/permission with microcomputer abnormality support HLDC5 for writing to the EEPROM 9. Further, in the fifth embodiment, a transistor is used as an example of a logic circuit, but the logic circuit has innumerable modifications, in the fifth embodiment, regardless of the type of logic circuit, it is characterized in that the WP terminal 20 of the EEPROM 9 is write-protected by using the voltage of the 5V power supply 6 and the reset signal 20 to the reset terminal 8 as triggers.

Figure 11:
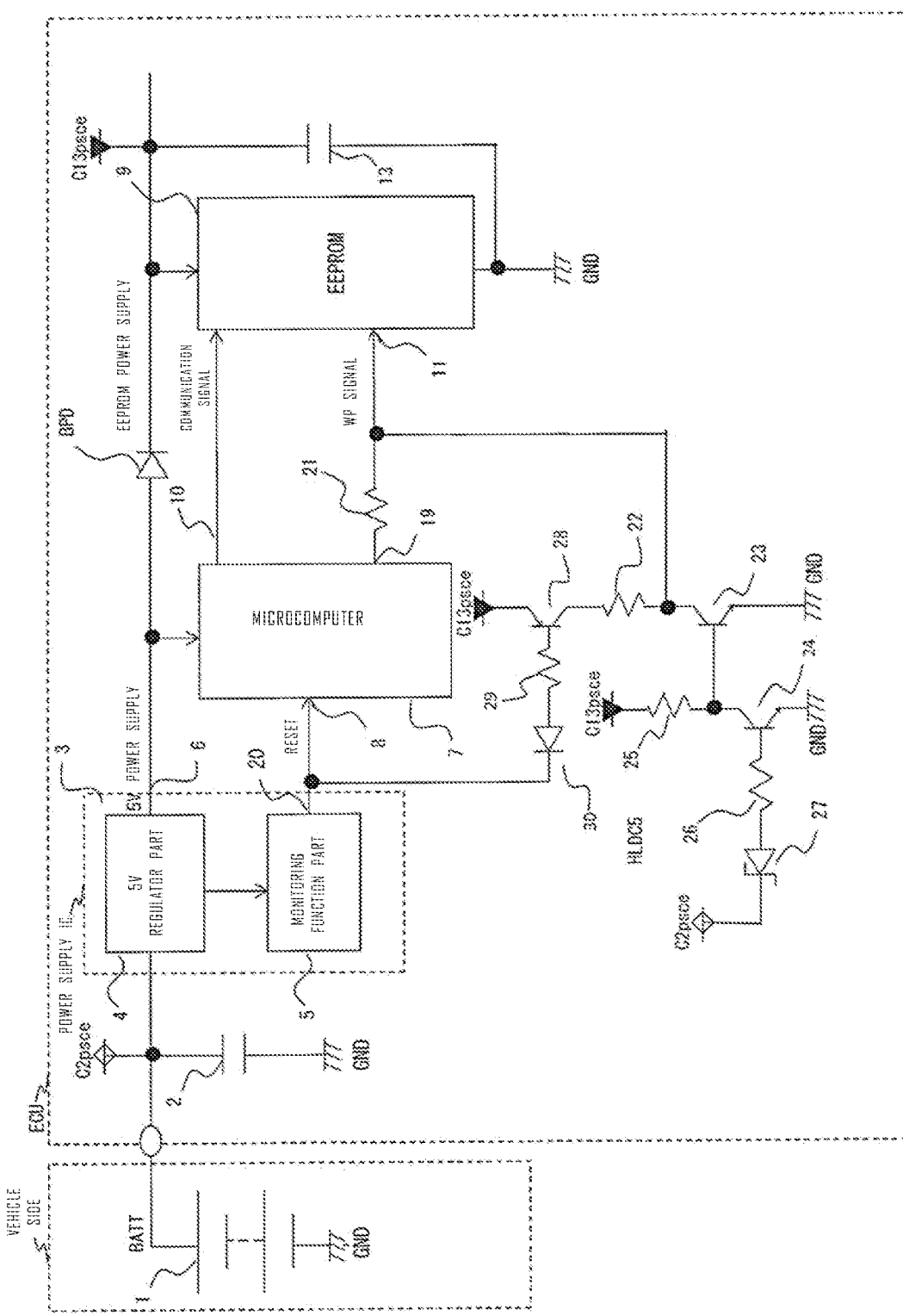
FIG. 11 is a circuit diagram showing an example of a nonvolatile memory writing device having a function of preventing garbled data in an external nonvolatile memory according to the fifth embodiment of the present application.
Figure 12:
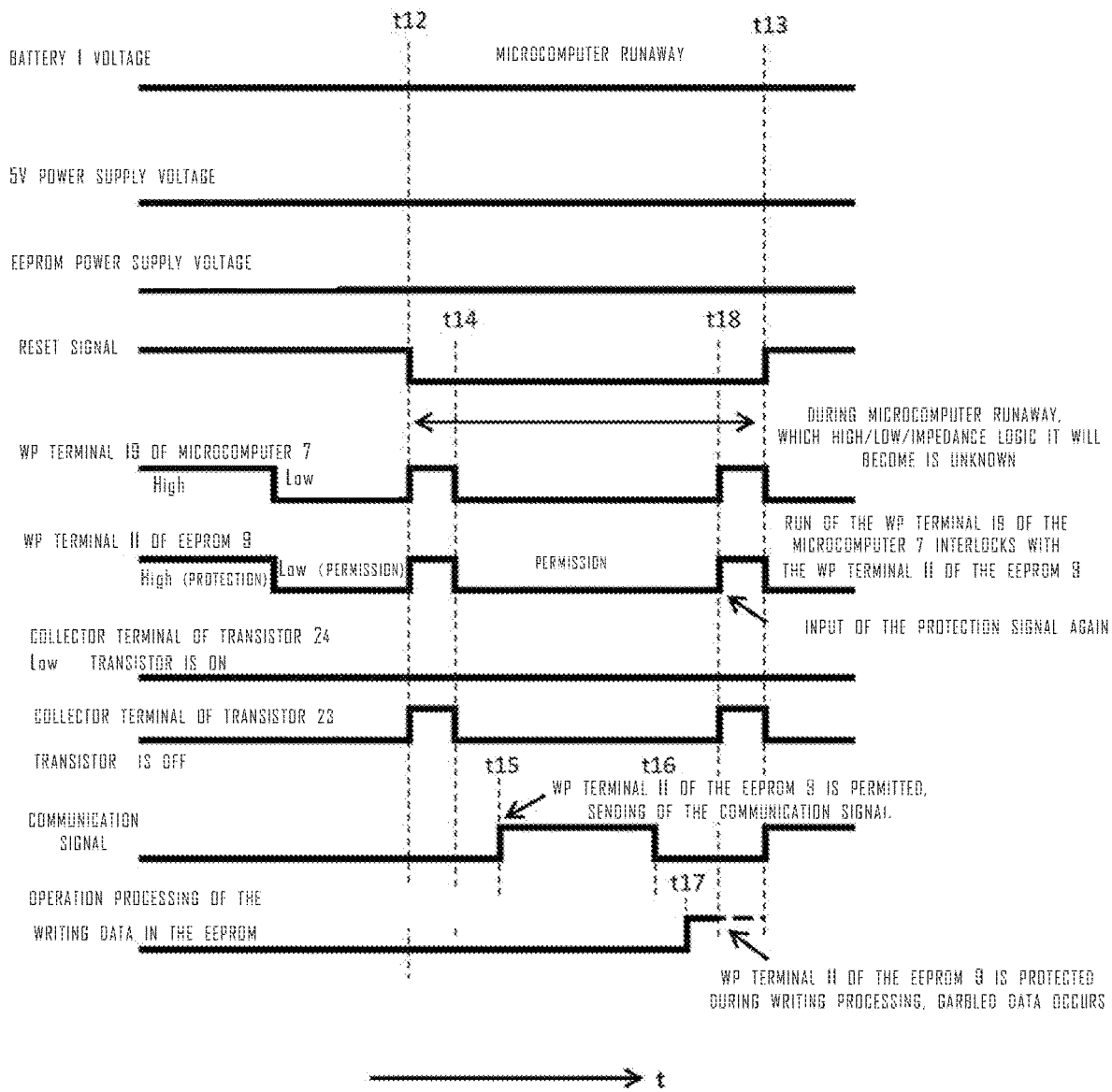
FIG. 12 is a diagram showing the relationship of the voltage, the signal, the processing and the state of operation at each point in the circuit of FIG. 8 according to the fourth embodiment of the present application, and illustrating an example of a problem that can be considered in the case of the fourth embodiment.
Figure 13:
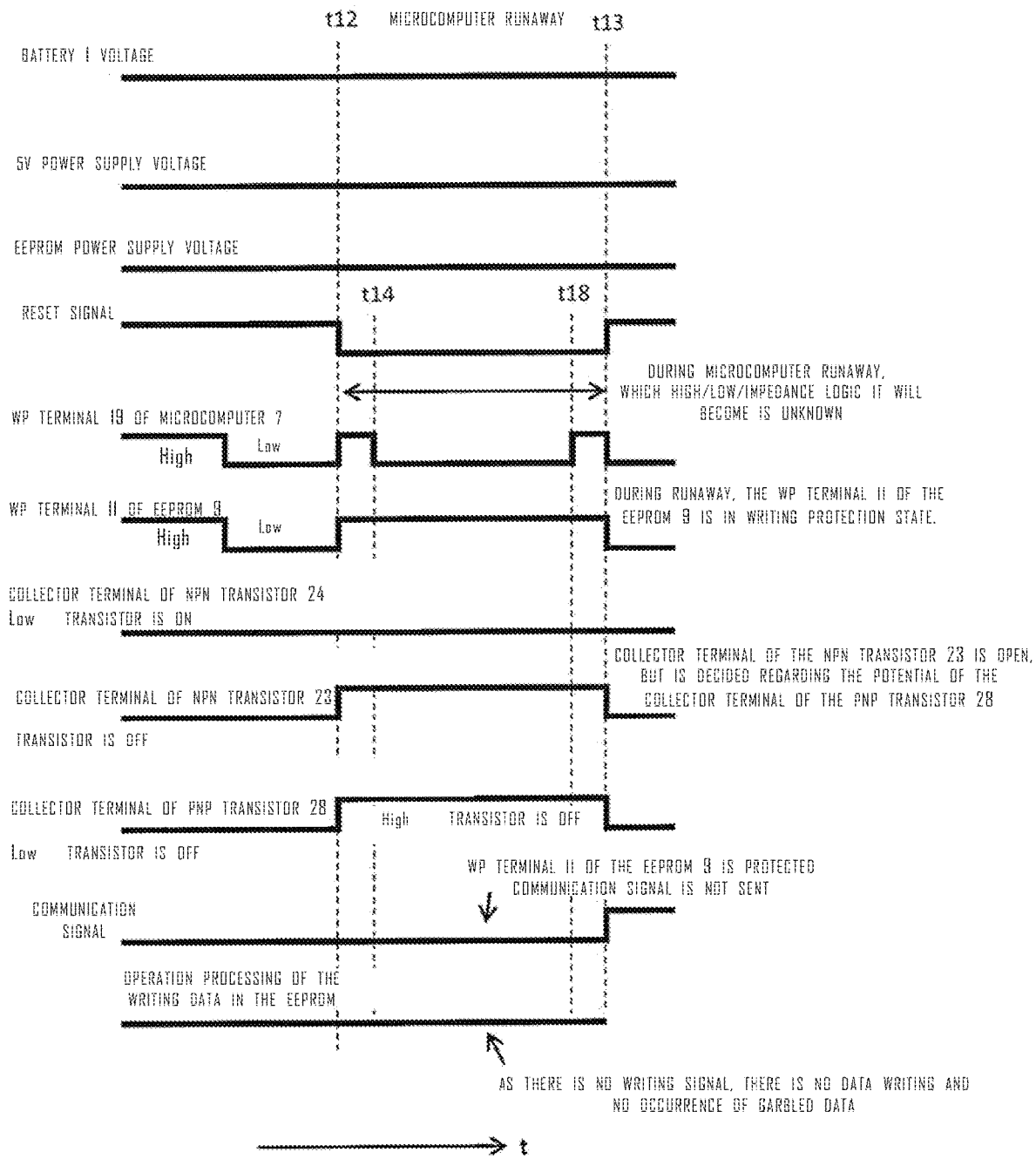
FIG. 13 is a diagram showing the relationship between voltage, signal, processing, and operating states at each point of the circuit of FIG. 11 according to the fifth embodiment of the present application.

FIG. 11 is an example of a circuit configuration showing the configuration inside the ECU and the configuration on the vehicle side according to the fifth embodiment of the present application. FIG. 12 illustrating an example of a problem that can be considered in the case of the fourth embodiment of the present application, FIG. 13 shows the operation of the voltage or processing at each point in FIG. 11

As illustrated in FIG. 11, a resistance 21 is connected between the WP terminal 19 of the microcomputer 7 and the WP terminal 20 of the EEPROM 9, the collector terminal of the NPN transistor 23 is connected between the resistance 21 and the WP terminal 20 of the EEPROM 9.

The emitter terminal of the NPN transistor 23 is grounded GND, and the base terminal of the NPN transistor 23 is connected to the collector terminal of the NPN transistor 24.

Further, the collector terminal of the NPN transistor 24 is connected to the positive power line of the capacitor 13 dedicated to the EEPROM 9 via the resistance 25.

The emitter terminal of the NPN transistor 24 is GND grounded, and the base terminal of the NPN transistor 24 is connected to the anode terminal of the zener diode 27 via a resistance 26.

The cathode terminal of the zener diode 27 is connected to the positive power supply line of the power supply capacitor 2 of the ECU.

The collector terminal of the NPN transistor 23 is connected to the collector terminal of a PNP transistor 28 via the resistance 22.

The emitter terminal of the PNP transistor 28 is connected to the positive power supply line of the capacitor 13 dedicated to the EEPROM 9.

The base terminal of the PNP transistor 28 is connected to the anode terminal of a diode 30 via a resistance 29. The cathode terminal of the diode 30 is connected to the reset terminal 8 of the 5V power supply IC 3.

Further, as described above, in FIG. 8 illustrated in the fourth embodiment, as is apparent from the above description and FIG. 8, the decision circuit for protection/permission with noise support HLDC4, composed of the resistance 21, the resistance 22, the transistor 23, the transistor 24, the resistance 25, the resistance 26, and the zener diode 27, is an example added to FIG. 3 as an example in the above-mentioned second embodiment. Therefore, even in the fourth embodiment illustrated in FIG. 8, the same operation as in the second embodiment described above can be performed, as in the case of the second embodiment, when the power supply voltage drops abnormally, the starting state maintenance voltage of the EEPROM 9 can be secured, so that the recorded data of the EEPROM 9 is not garbled. Further, FIG. 11 exemplified in the present embodiment 5 is an example of the decision circuit HLDC5 for protection/permission with microcomputer abnormality support in which the PNP transistor 28, the resistance 29, and the diode 30 are added to FIG. 8 exemplified in the above-described fourth embodiment. Therefore, even in the fifth embodiment illustrated in FIG. 11, the same operation as in the second embodiment described above can be performed, as in the case of the second embodiment, when the power supply voltage drops abnormally, the starting state maintenance voltage of the EEPROM 9 can be secured, so that the recorded data of the EEPROM 9 is not garbled.

In the fourth embodiment, the input trigger of the circuit that controls the logic of the WP terminal 20 of the EEPROM 9 (the circuit consisting of the parts of resistance 21, transistor 23, transistor 24, resistance 25, resistance 26, and zener diode 27) was only 5V power supply 6. The operation of the circuit that controls the logic of the WP terminal 20 of the EEPROM 9 is that when the 5V power supply 6 outputs 5V, the cathode terminal of the zener diode 27 exceeds the zener voltage and turns on the transistor 24. When the transistor 24 is turned on, the base terminal of the transistor 23 is turned low and the transistor 23 is turned off, so that the collector terminal of the transistor 23 is opened, the write permission/protection state of the WP terminal 20 of the EEPROM 9 is determined by the voltage of the WP terminal 19 of the microcomputer 7.

If the microcomputer 7 goes out of control unexpectedly due to some external factor, such as noise, the signal output from the WP terminal 19 of the microcomputer 7 may be high, in other words, write-protected. Therefore, if an unexpected runaway of the microcomputer 7 occurs while the EEPROM 9 is in the data writing operation, in other words, during the data writing process, the data in the EEPROM 9 is garbled.

In the fifth embodiment, the reset signal 20 to the reset terminal 8 is added as a trigger to the fourth embodiment.

As the possible logic pattern is when the ECU power supply capacitor 2 and reset terminal 8 are high, the ECU power supply capacitor 2 is high and the reset terminal 8 is low, and the ECU power supply capacitor 2 and reset terminal 8 are low, each one is described.

When the power supply capacitor 2 of the ECU is low and the reset terminal 8 is high, the power supply IC 3 also has a monitoring function part 5 that monitors the output voltage of the 5V power supply 6 inside, as a reset signal (low) is output when the 5V power supply 6 falls below the reset detection voltage, it does not exist when the power supply capacitor 2 of the ECU is low and the reset terminal 8 is high.

Then, the operation leading to the operation of the data writing process to the EEPROM 9 will be described with reference to FIG. 12, which is a diagram showing the relationship between voltage, signal, processing and operation states at each point of FIG. 8. In FIG. 12, each operation other than the unexpected runaway of the microcomputer 7 in the section from the points of time t12 to t13 is the same as that in FIG. 10, so the description of the operation is omitted.

In the section from points of time t12 to t13, the microcomputer 7 went out of control unexpectedly due to noise, when the WP terminal 19 of the microcomputer 7 repeats the permission/protection, the WP terminal 20 of the EEPROM 9 also repeats the permission/protection. If permission is given during an unexpected microcomputer runaway as shown in t14, if there is write information, the communication signal 10 is transferred from the microcomputer 7 to the EEPROM 9 like t15 to t16, and the EEPROM 9 writes to the internal register like t17, when writing is performed, in other words, during the writing process, when the protection signal is input like t18, garbled data occurs.

Then, the operation leading to the operation of the data writing process to the EEPROM will be described with reference to FIG. 13, which is a diagram showing the relationship between voltage, signal, processing and operation states at each point of FIG. 11. In FIG. 13, each operation is the same as in FIG. 12, so the description of the operation is omitted.

If an unexpected runaway of the microcomputer occurs due to noise in the section from the points of time t12 to t13, the monitoring function part 5 of the 5V power supply IC 3 outputs a reset signal 20 (Low). When the 5V power supply IC 3 outputs a reset signal 20 (Low), the PNP transistor 28 turns on and the collector terminal becomes high. At this time, since the voltage of the power supply capacitor 2 of the ECU is high, the cathode terminal of the zener diode 27 exceeds the zener voltage, and the NPN transistor 24 is turned on. Then, the base terminal of the NPN transistor 23 becomes low and off, so that the collector terminal of the transistor 23 becomes the open state, and the logical state of the WP terminal 11 of the EEPROM 9 becomes High (write-protected). Therefore, it is possible to prevent garbled data because writing is not possible during an unexpected runaway of the microcomputer.

Further, it is not illustrated in FIG. 13, but when the potential on the positive power supply side of the power supply capacitor 2 begins to decrease due to the same cause as in the above-described first embodiment, the zener diode 27 becomes non-conducting at the point of time t6, the transistor 24 is turned off and the collector potential of the transistor 24 is high. When the collector potential of the transistor 24 becomes high, the transistor 23 becomes on, and the WP terminal 11 of the EEPROM 9 becomes the ground GND potential and becomes low (write permission state). Therefore, when the potential on the positive power supply side of the power supply capacitor 2 begins to drop, until the potential on the positive power supply side of the capacitor 13, which is the dedicated power supply for EEPROM 9, drops below the starting state maintenance voltage of the EEPROM 9, it is possible to write the recorded data transmitted by the communication signal 10 to the EEPROM 9.

The decision circuit HLDC5 for protection/permission with microcomputer abnormality support in the fifth embodiment is triggered by the potential on the positive power supply side of the power supply capacitor 2, in other words the power supply voltage of the battery 1, the 5V power supply 6, and the reset signal, it is an example of responding to fluctuations in the potential on the positive power supply side of the power supply capacitor 2, the decision circuit HLDC5 for protection/permission with microcomputer abnormality support can obtain the same effect by responding to the voltage fluctuation of the power supply by using the 3.3V power supply (see FIG. 6) instead of the 5V power supply 6 as a trigger.

Further, the ground GND is a grounding target on the negative power supply side, which is common to all the battery 1, power capacitor 2, 5V power supply 6, 3.3V power supply, resistance 12 (see FIGS. 1, 3 and 6), capacitor 13 (see FIG. 3), capacitor 18 (see FIG. 6), transistors 23, 24 (see FIGS. 8 and 11) In other words, the ground GND corresponds to the negative power supply of each power supply (battery 1, power supply capacitor 2, 5V power supply 6, 3.3V power supply, capacitor 13, and capacitor 18).

Although various exemplary embodiments and examples are described in this application, the various features, modes, and functions described in one or more embodiments are not limited to the application of a particular embodiment, but can be applied to embodiments alone or in various combinations.

Accordingly, countless variations not illustrated are envisioned within the scope of the art disclosed in this application. For example, this shall include cases where at least one component is transformed, added or omitted, and even where at least one component is extracted and combined with components of other embodiments.

Further, each embodiment can be appropriately modified, omitted, and combined.

In the drawings, the same reference numerals indicate the same or corresponding parts.

REFERENCE SIGNS LIST

1. Battery,
2. Power supply capacitor,
3. Power supply IC,
4. 5V regulator part,
5. Monitoring function part,
6. 5V power supply,
7. Microcomputer,
8. Reset terminal,
9. EEPROM,
10. Communication signal,
11. WP terminal of the EEPROM 9,
12. Resistance, 1112 Connection point,
13. Capacitor,
14. 3.3V Power supply IC,
15. 5V input terminal,
16. 3.3V regulator part,
17. 3.3V output terminal,
18. Output stabilization capacitor,
19. WP terminal of the microcomputer 7,
20. Reset signal,
21. Resistance,
22. Resistance,
23. NPN Transistor,
24. NPN Transistor,
25. Resistance,
26. Resistance,
27. Zener diode,
28. PNP Transistor,
29. Resistance,
30. Diode,
BPD Diode for preventing reverse flow,
GND Ground,
HLDC4. Decision circuit for protection/permission with noise support, HLDC5. Decision circuit for protection/permission with microcomputer abnormality support,
3.3Vce Connection terminal,
5Vce Connection terminal,
C2*psce* Connection terminal,
C13*psce* Connection terminal.

The invention claimed is:

1. A nonvolatile memory writing device wherein,
a nonvolatile memory writing device that writes write data transmitted from a microcomputer to a nonvolatile memory is provided outside the microcomputer,
the nonvolatile memory is connected to a power supply of the microcomputer, and is one in which writing of the writing data is protected and the protection is disabled by an electric signal from the microcomputer to a write-protect terminal of the nonvolatile memory,
the write-protect terminal is connected to a ground of a negative power supply side of the power supply of the microcomputer via a resistor,
when a voltage drop is detected by a monitoring function part that monitors the power supply, the electric signal from the microcomputer to the write-protect terminal is interrupted and an output from the microcontroller to the write-protect terminal becomes high-impedance, and the protection is disabled.

2. The nonvolatile memory writing device according to claim 1 wherein,
the write protect terminal is in a disabled state of the protection, when the output of the microcomputer is stopped.

3. The nonvolatile memory writing device according to claim 1 wherein,
the nonvolatile memory has a dedicated power supply dedicated to the nonvolatile memory that supplies power to the nonvolatile memory,
the nonvolatile memory is supplied with power from the dedicated power supply when a voltage of the power supply of the microcomputer drops.

4. The nonvolatile memory writing device according to claim 1 wherein,
the nonvolatile memory has a dedicated power supply dedicated to the nonvolatile memory that supplies power to the nonvolatile memory,
the nonvolatile memory is supplied with power from the dedicated power supply when a voltage of the power supply of the microcomputer drops.

5. The nonvolatile memory writing device according to claim 3 wherein,
the dedicated power supply is a capacitor, and power is supplied to the nonvolatile memory from the capacitor in which electric charges are accumulated by the power supply of the microcomputer.

6. The nonvolatile memory writing device according to claim 4 wherein,
the dedicated power supply is a capacitor, and power is supplied to the nonvolatile memory from the capacitor in which electric charges are accumulated by the power supply of the microcomputer.

7. The nonvolatile memory writing device according to claim 3 wherein,
the dedicated power supply is a power supply generated by adjusting the voltage of the power supply of the microcomputer to a predetermined voltage, and the predetermined voltage is a voltage higher than a voltage capable of maintaining the activated state of the nonvolatile memory.

8. The nonvolatile memory writing device according to claim 4 wherein,
the dedicated power supply is a power supply generated by adjusting the voltage of the power supply of the microcomputer to a predetermined voltage, and the predetermined voltage is a voltage higher than a voltage capable of maintaining the activated state of the nonvolatile memory.

9. The nonvolatile memory writing device according to claim 3 wherein,
the predetermined voltage is a voltage lower than the voltage of the power supply of the microcomputer.

10. The nonvolatile memory writing device according to claim 4 wherein,
the predetermined voltage is a voltage lower than the voltage of the power supply of the microcomputer.

11. The nonvolatile memory writing device according to claim 1 wherein,
a decision circuit for protection/permission with noise support is provided to control the write protection of the write-protect terminal of the nonvolatile memory and the disabled state of the protection in response to the voltage drop of the power supply of the microcomputer.

12. The nonvolatile memory writing device according to claim 10 wherein,
a decision circuit for protection/permission with noise support is provided to control the write protection of the write-protect terminal of the nonvolatile memory and the disabled state of the protection in response to the voltage drop of the power supply of the microcomputer.

13. A nonvolatile memory writing device wherein,
a nonvolatile memory writing device that writes write data transmitted from a microcomputer to a nonvolatile memory is provided outside the microcomputer,
the nonvolatile memory is a nonvolatile memory in which writing of the writing data is protected and the protection is disabled by an electric signal from the microcomputer to a write-protect terminal of the nonvolatile memory,
when the electric signal from the microcomputer to the write-protect terminal is interrupted, the protection is disabled, and
when the microcomputer is reset due to noise, the write-protect terminal of the nonvolatile memory is controlled to be write-protected by a decision circuit for protection/permission with noise support, and writing of the noise to the nonvolatile memory is protected.

14. The nonvolatile memory writing device according to claim 13 wherein,
a monitoring function part for monitoring the noise is provided, and the monitoring function part outputs a reset signal to the microcomputer based on the noise monitoring result.

15. A nonvolatile memory writing device wherein,
a nonvolatile memory writing device that writes write data transmitted from a microcomputer to a nonvolatile memory is provided outside the microcomputer,
the nonvolatile memory is a nonvolatile memory in which writing of the writing data is protected and the protection is disabled by an electric signal from the microcomputer to a write-protect terminal of the nonvolatile memory,
when the electric signal from the microcomputer to the write-protect terminal is interrupted, the protection is disabled, and a decision circuit for protection/permission with microcomputer abnormality support is provided to control a state of the write protection and of the write-protect terminal of the nonvolatile memory and the disabled state of the protection in response to the voltage drop of the power supply of the microcomputer and the reset signal to the microcomputer.

16. The nonvolatile memory writing device according to claim 10 wherein, the decision circuit for protection/permission with microcomputer abnormality support is provided to control a state of the write protection and of the write-protect terminal of the nonvolatile memory and the disabled state of the protection in response to the voltage drop of the power supply of the microcomputer and the reset signal to the microcomputer.

17. The nonvolatile memory writing device according to claim 15 wherein, when the microcomputer is reset during the period of the abnormality due to the abnormality of the microcomputer, the write-protect terminal of the nonvolatile memory is controlled to be write-protected by the decision circuit for protection/permission with microcomputer abnormality support, writing to nonvolatile memory is protected during the abnormal period of the microcomputer.

18. The nonvolatile memory writing device according to claim 17 wherein, the monitoring function part that outputs a reset signal to the microcomputer in response to an abnormality of the microcomputer is provided.

* * * * *